(12) United States Patent
Kobayashi (10) Patent No.: US 9,933,304 B2
(45) Date of Patent: Apr. 3, 2018

(54) ACTIVE PHOTONIC DEVICE HAVING A DARLINGTON CONFIGURATION WITH FEEDBACK

(71) Applicant: Qorvo US, Inc., Greensboro, NC (US)

(72) Inventor: Kevin Wesley Kobayashi, Redondo Beach, CA (US)

(73) Assignee: Qorvo US, Inc., Greensboro, NC (US)

( * ) Notice: Subject to any disclaimer, the term of this patent is extended or adjusted under 35 U.S.C. 154(b) by 66 days.

(21) Appl. No.: 15/219,879

(22) Filed: Jul. 26, 2016

(65) Prior Publication Data

US 2017/0097261 A1   Apr. 6, 2017

Related U.S. Application Data

(60) Provisional application No. 62/236,572, filed on Oct. 2, 2015.

(51) Int. Cl.
*G01J 1/44*       (2006.01)
*H04B 10/60*    (2013.01)

(52) U.S. Cl.
CPC ............... *G01J 1/44* (2013.01); *H04B 10/60* (2013.01); *G01J 2001/4466* (2013.01)

(58) Field of Classification Search
CPC ...... G01J 1/44; G01J 2001/4466; H04B 10/60
USPC ....................................................... 250/214.1
See application file for complete search history.

(56) References Cited

U.S. PATENT DOCUMENTS

| | | |
|---|---|---|
| 3,046,405 A | 1/1959 | Emeis |
| 4,236,119 A | 11/1980 | Battjes |
| 4,951,106 A * | 8/1990 | Blouke ............ G01J 3/26 257/222 |
| 4,977,314 A * | 12/1990 | Niwa ............ G01N 15/0211 250/208.2 |
| 5,541,439 A | 7/1996 | Mojaradi et al. |
| 6,504,429 B2 | 1/2003 | Kobayashi |
| 7,067,853 B1 | 6/2006 | Yao |
| 2003/0160266 A1 | 8/2003 | Yanagisawa |
| 2003/0218185 A1 | 11/2003 | Ohbu et al. |
| 2004/0065900 A1 | 4/2004 | Umemoto et al. |

(Continued)

OTHER PUBLICATIONS

Author Unknown, "043643: 10Gb/s InGaAs/InAlAs Avalanche Photodetector (APD) Die," Spectrolab, Revision A, May 24, 2012, 2 pages.

(Continued)

*Primary Examiner* — Seung C Sohn
(74) *Attorney, Agent, or Firm* — Withrow & Terranova, P.L.L.C.

(57) ABSTRACT

An active photonic device having a Darlington configuration is disclosed. The active photonic device has a collector layer over a substrate, a base layer over the collector layer, and an emitter layer over the base layer. A connector structure electrically couples an inner emitter region with an outer base region, wherein the collector layer, base layer, the emitter layer and the connector structure are substantially centered within a first region over the substrate. A feedback resistor is coupled between an inner collector region and an inner base region. At least a portion of the feedback resistor is arc-shaped and resides over a first arcuate path defined by a substantially constant first radius centered in the first region.

34 Claims, 9 Drawing Sheets

(56) References Cited

U.S. PATENT DOCUMENTS

2008/0087918 A1     4/2008   Ardent
2015/0372181 A1   12/2015   Kobayashi et al.

OTHER PUBLICATIONS

Author Unknown, "AP1503-20L5: 10 Gb/s 1550nm Avalanche Photodiode," SiFotonics, Jul. 2013, 1 page.
Author Unknown, "Ge/Si APD," SiFotonics, 2015, 1 page, http://sifotonics.com/en/index.php?m=default.product_apd&bid=7.
Author Unknown, "Welcome to Spectrolab," Spectrolab: A Boeing Company, 2009-2014, www.spectrolab.com.
Author Unknown, "World Best 25G APD," SiFotonics, 2016, 1 page, www.sifotonics.com.
De Barros, Jr., L.E.M et al., "Noise Performance of HBT as Photodetector in Analog Fiber-optic Communication Link," SBMO/IEEE MTT-S IMOC'97 Proceedings, Aug. 1997, IEEE, pp. 338-343.
Chong, Li et al., "High bandwidth surface-illuminated InGaAs/InP uni-travelling-carrier photodetector," Chinese Physics B, vol. 22, No. 11, 2013, 5 pages.
Bilenca, Alberto et al., "Millimeter-Wave Generation and Digital Modulation in an InGaAs—InP Heterojunction Phototransistor: Model and Experimental Characterization of Dynamics and Noise," Journal of Lightwave Technology, vol. 19, No. 9, Sep. 2001, pp. 1340-1351.
Gonzalez, C. et al., "A 28 GHz HPT/HBT Monolithically Integrated Photoreceiver for Hybrid Fibre Radio Distribution Systems," 2000 8th IEEE International Symposium on High Performance Electron Devices for Microwave and Dptoelectronic Applications, Nov. 2000, pp. 55-60.
Jo, Young-Chang et al., "Optical Properties of 1 by 16 Highly Sensitive InP/InGaAs Heterojunction Phototransistor Arrays," Proceedings of IEEE Sensors, 2004, pp. 1305-1307.
Kosaka, Hideo, "Smart Integration and Packaging of 2-D VCSEL's for High-Speed Parallel Links," IEEE Journal of Selected Topics in Quantum Electronics, vol. 5, No. 2, Mar./Apr. 1999, pp. 184-192.
Moriizumi, Toyosaka et al., "Theoretical Analysis of Heterojunction Phototransistors," IEEE Transactions on Electron Devices, vol. 19, No. 2, Feb. 1972, pp. 152-159.
Pei, Z. et al., "Integratable SiGe Phototransistor with High Speed (BW=3 GHz) and Extremely-High Avalanche Responsivity," 2003 International Semiconductor Device Research Symposium, Dec. 2003, pp. 18-19.
Prakash, D. P. et al., "Integration of Polyimide Waveguides with Traveling-Wave Phototransistors," IEEE Photonics Technology Letters, vol. 9, No. 6, Jun. 1997, pp. 800-802.
Scott, D. C. et al., "60GHz Sources Using Optically Driven HBTs," 1992 IEEE MTT-S International Microwave Symposium Digest, 1992, pp. 811-814.
Scott, D. C. et al., "High-Power High-Frequency Traveling-Wave Heterojunction Phototransistors with Integrated Polyimide Waveguide," IEEE Microwave and Guided Wave Letters, vol. 8, No. 8, Aug. 1998, pp. 284-286.
Wang, H. et al., "GaAs/GaAlAs Heterojunction Bipolar Phototransistor for Monolithic Photoreceiver Operating At 140 Mbit/s," 1986 IEEE MTT-S International Microwave Symposium Digest, 1986, pp. 717-719.
Non-Final Office Action for U.S. Appl. No. 14/746,958, dated Apr. 11, 2017, 14 pages.

* cited by examiner

ACTIVE PHOTONIC DEVICE HAVING A DARLINGTON CONFIGURATION WITH FEEDBACK

RELATED APPLICATIONS

This application claims the benefit of provisional patent application No. 62/236,572, filed Oct. 2, 2015, the disclosure of which is hereby incorporated herein by reference in its entirety.

FIELD OF THE DISCLOSURE

The present disclosure relates to active photonic devices. In particular, the present disclosure relates to geometric configurations for active photonic devices that are usable as light detectors in optical communication receivers.

BACKGROUND

Fiber optic communication provides a major portion of the backbone of the Internet. As such, photonic devices such as lasers are used for lightwave signal transmission and photodiodes (PDs) are used for lightwave signal reception. These traditional photonic devices have parasitic inductances and parasitic capacitances that limit high frequency operation for high data rate applications such as 10-100 Gbps serial communications that are transmitted and received using lightwave signals. Moreover, a particularly sensitive photodiode, known as an avalanche photodiode (APD), is used in long haul (LH) fiber optic communication and requires a relatively high supply voltage of on the order of 50V and greater for proper operation to achieve high sensitivity enabled by the intrinsic gain of the photodetector device. Thus, what is needed is an active photonic device that has substantially reduced parasitic inductances and reduced parasitic capacitances such that high data rates of 10-100 Gbps and higher are achievable using lightwave signals. Moreover, the needed active photonic device preferably operates with a relatively low supply voltage of around 3V and includes feedback.

SUMMARY

An active photonic device having a Darlington configuration is disclosed. The active photonic device has a collector layer over a substrate, a base layer over the collector layer, and an emitter layer over the base layer. The collector layer includes an inner collector region and an outer collector region that substantially surrounds the inner collector region. The base layer includes an inner base region and an outer base region that substantially surrounds the inner base region and is spaced apart from the inner base region. The emitter layer includes an emitter region that is ring-shaped and resides over and extends substantially around an outer periphery of the inner base region. The emitter layer further includes an outer emitter region that is ring-shaped and resides over and extends substantially around the outer base region. A connector structure electrically couples an inner emitter region with an outer base region, wherein the collector layer, the base layer, the emitter layer, and the connector structure are substantially centered within a first region over the substrate. A feedback resistor is coupled between an inner collector region and an inner base region. At least a portion of the feedback resistor is arc-shaped and resides over a first arcuate path defined by a substantially constant first radius centered in the first region.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. For example, the phrase "substantially centered" means centered within ±10%, and the phrase "substantially constant radius" means a radial length that is maintained to within ± of an average radius. Moreover, the phrase "substantially around" means at least 50% around.

Figure 1:
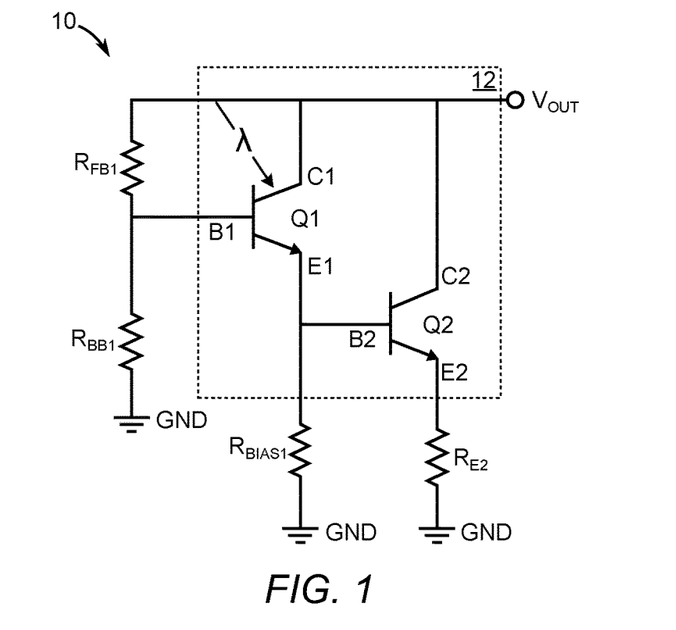
FIG. 1 is a symbolic diagram of an active photonic device of the present disclosure depicted in a common-emitter configuration with feedback.
Figure 2:
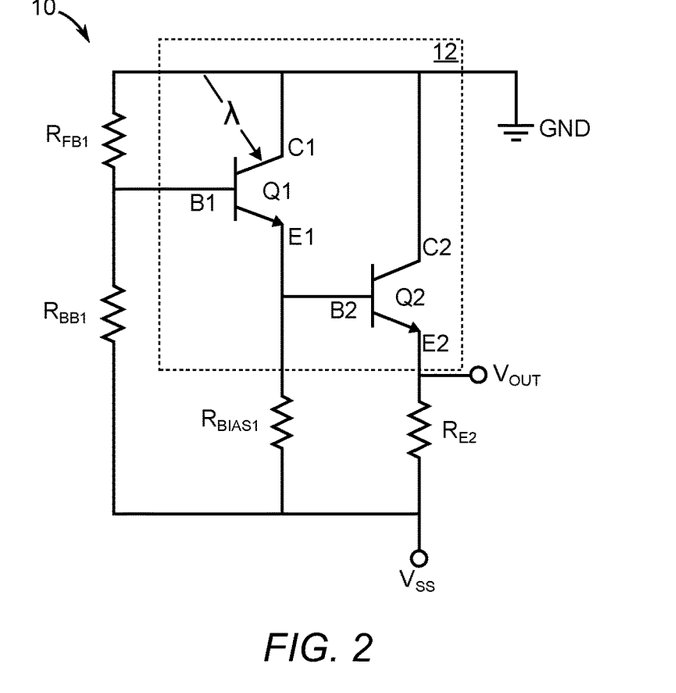
FIG. 2 is a symbolic diagram of the active photonic device of the present disclosure depicted in a common-collector configuration with feedback.
Figure 3:
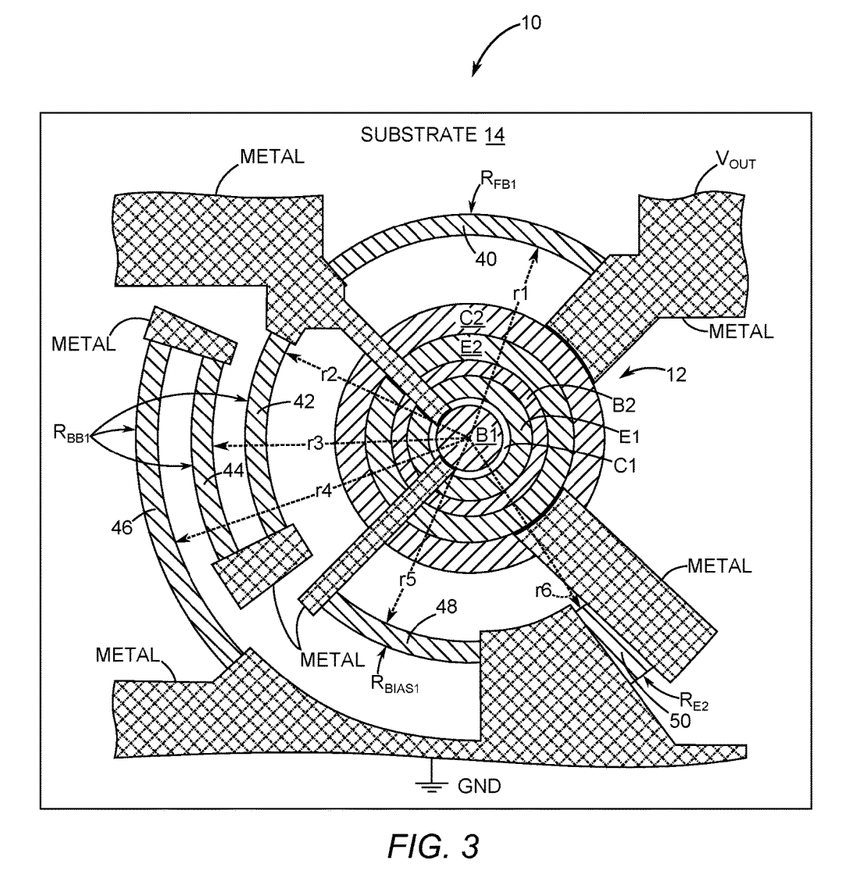
FIG. 3 is a top plan view showing a circular geometry for the common-emitter configuration of the active photonic device with feedback.

FIG. 1 is a symbolic diagram of an active photonic device 10 of the present disclosure depicted in a common-emitter configuration with feedback. FIG. 2 is a symbolic diagram of the active photonic device 10 depicted in a common-collector configuration with feedback. FIG. 3 is a top plan view showing a circular geometry for the common-emitter configuration of the active photonic device 10 with feedback. It is to be understood that the common-collector configuration has a similar circular geometry with the only exceptions being ground, voltage source, and output terminal connections. Both of the common-emitter and common-collector configurations for the active device 10 each realize a heterojunction photonic Darlington-transimpedance amplifier (HPD-TIA) opto-electric integrated circuit (OEIC).

Returning to FIG. 1 and FIG. 2, the active photonic device 10 is symbolically represented as having a first transistor Q1 with an inner collector C1, an inner base B1, and an inner emitter E1. The first transistor Q1 is responsive to light λ such that an increase in light intensity causes an increase in current flow through the first transistor Q1. The active photonic device 10 is further symbolically represented as having a second transistor Q2 with an outer collector C2, an outer base B2, and an outer emitter E2. Both of the common-emitter configuration (FIG. 1) and the common-collector configuration (FIG. 2) of the photonic device 10 have the inner emitter E1 of the first transistor Q1 and the outer base B2 coupled together to realize a heterojunction photo-Darlington (HPD) transistor configuration 12. Moreover, in both configurations the inner collector C1 is coupled to the outer collector C2. In some embodiments, the inner collector C1 and the outer collector C2 are one and the same in that there is no physical isolation between the inner collector C1 and the outer collector C2. In the common-emitter configuration (FIG. 1), the outer collector C2 is coupled to an output terminal $V_{OUT}$. In contrast, the common-collector configuration (FIG. 2) has the outer collector C2 coupled to ground GND and the output terminal $V_{OUT}$ is coupled to the outer emitter E2.

Both of the common-emitter configuration and the common-collector configuration have a feedback resistor $R_{FB1}$ coupled between the inner base B1 and both of the inner collector C1 and the outer collector C2. The common-emitter and common-collector configurations each include a bias resistor $R_{BIAS1}$ and an emitter resistor $R_{E2}$. In the case of the common-emitter configuration, the bias resistor $R_{BIAS1}$ is coupled between the inner emitter E1 and ground GND, while the emitter resistor $R_{E2}$ is coupled between the outer emitter E2 and ground GND. In contrast, the common-collector configuration has the bias resistor $R_{BIAS1}$ coupled between the inner emitter E1 and a negative voltage source $V_{SS}$, while the emitter resistor $R_{E2}$ is coupled between the outer emitter E2 and the negative voltage source $V_{SS}$.

A base resistor $R_{BB1}$ can be included in both of the common-emitter and common-collector configurations. In the case of the common-emitter configuration, the base resistor $R_{BB1}$ is coupled between the inner base B1 and ground GND, whereas in the common-collector configuration, the base resistor $R_{BB1}$ is coupled between the inner base B1 and the negative voltage source $V_{SS}$. The base resistor $R_{BB1}$ in conjunction with feedback resistor $R_{FB1}$ sets a reverse bias voltage across the base-collector junction of the first transistor Q1 to maximize intrinsic photonic signal responsivity and bandwidth.

The bias resistor $R_{BIAS1}$ sets a quiescent bias for the first transistor Q1. An exemplary bias current ($I_{BIAS}$) for the first transistor Q1 is approximately a base-to-emitter voltage (Vbe) divided by the resistance of the bias resistor $R_{BIAS1}$ (i.e., $I_{BIAS} = Vbe/R_{BIAS1}$). Moreover, various levels of current gain between $\beta$ and $\beta^2$ can be achieved by adjusting a relative bias between the first transistor Q1 and the second transistor Q2. The current gain for the active photonic device 10 can be predetermined by adjusting relative sizes of emitter areas between the first transistor Q1 and the second transistor Q2 during fabrication. A current gain of approximately two times β (i.e., 2·β) with a single pole response in band can be achieved by making the emitter areas and the bias current of the first transistor Q1 and the second transistor Q2 equal. In a range close to 2·β, parallel and/or series feedback involving the feedback resistor $R_{FB1}$ and the emitter resistor $R_{E2}$, respectively, is employable to achieve a desired overall responsivity-bandwidth, a transimpedance gain-bandwidth and/or an optical-electrical gain-bandwidth response.

Figure 4:
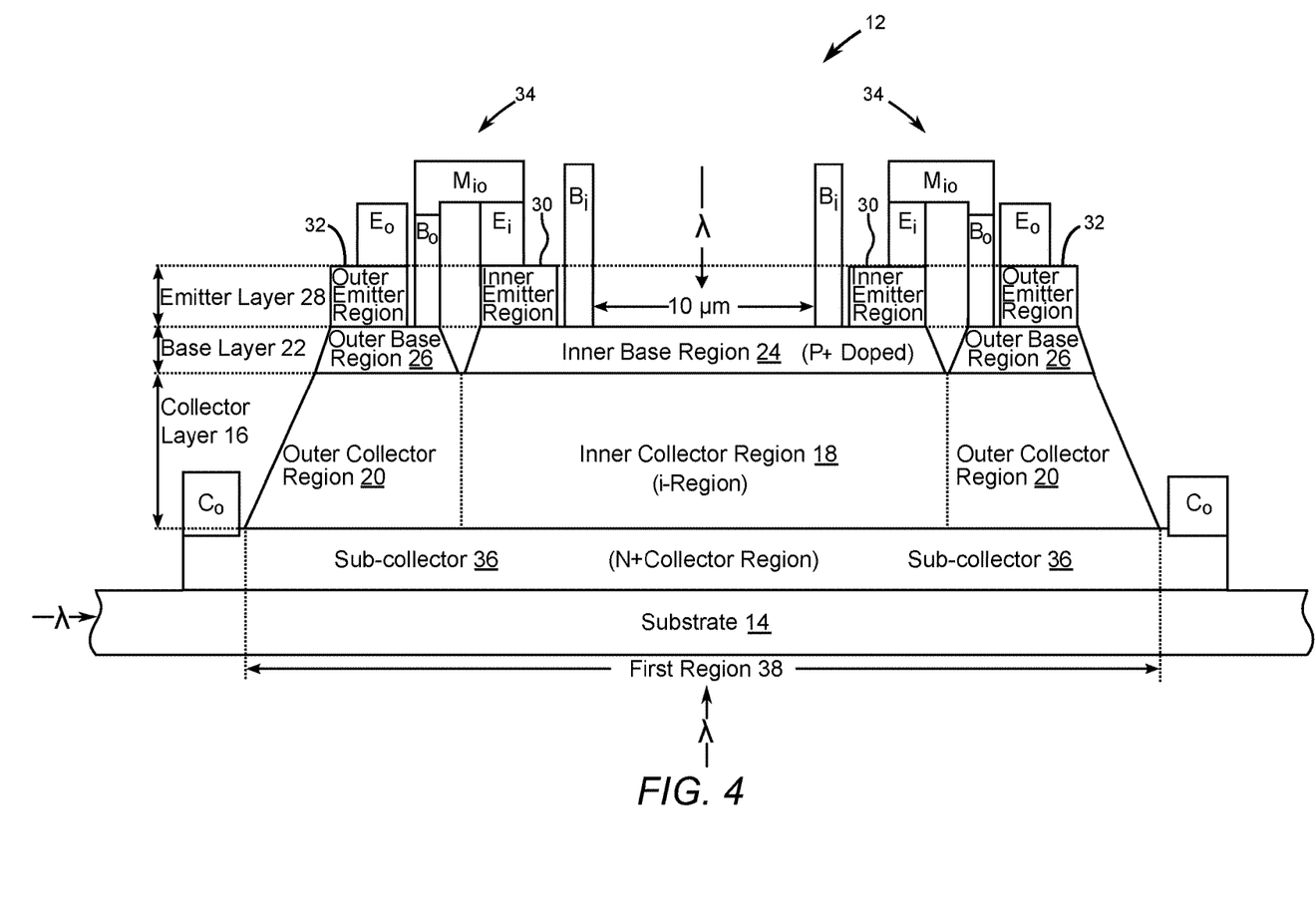
FIG. 4 is a vertical cross-section diagram of a heterojunction photo-Darlington (HPD) transistor configuration that is shown symbolically in FIG. 1 and FIG. 2.

FIG. 4 is a vertical cross-section diagram of the HPD transistor configuration 12 that is shown symbolically in FIG. 1 and FIG. 2. Referring now to both FIG. 3 and FIG. 4, the active photonic device 10 has a substrate 14 over which a collector layer 16 resides. The collector layer 16 has an inner collector region 18 and an outer collector region 20 that substantially surrounds the inner collector region 18. A base layer 22 resides over the collector layer 16. The base layer 22 includes an inner base region 24 and an outer base region 26 that substantially surrounds and is spaced apart from the inner base region 24. For reference of scale, an exemplary light opening for the inner base region 24 has a diameter that is on the order of 10 microns. However, in at least one embodiment, the substrate 14 accepts edge illuminating modulated light signals from the side and guides the data signals to the inner collector region 18. In at least another embodiment, the substrate 14 is translucent to back-side illuminating modulated light signals that pass through the substrate 14 and into the inner collector region 18.

An emitter layer 28 resides over the base layer 22. The emitter layer 28 includes an inner emitter region 30 that is ring-shaped and resides over and extends substantially around an outer periphery of the inner base region 24. The emitter layer 28 includes an outer emitter region 32 that is ring-shaped and resides over and extends substantially around the outer base region 26. A connector structure 34 electrically couples the inner emitter region 30 with the outer base region 26, wherein the collector layer 16, base layer 22, the emitter layer 28, and the connector structure 34 are substantially centered within a first region 38 over the substrate 14. The connector structure 34 includes a metal conductor $M_{io}$ that couples an inner emitter contact $E_i$ disposed on the inner emitter region 30 to an outer base contact $B_o$ disposed on the outer base region 26. An electrical signal corresponding to a light signal is typically output from an outer collector contact $C_O$, which in turn is coupled to the output terminal $V_{OUT}$. In at least some embodiments, a sub-collector 36 resides between the substrate 14 and the collector layer 16. An inner base contact $B_i$ is in contact with the inner base region 24. In the exemplary embodiment, the sub-collector 36 is negatively doped (n+). In at least some of the embodiments, the collector layer 16, the base layer 22 and the emitter layer 28 are made of group III-V semiconductor materials.

Referring in particular to FIG. 3, the feedback resistor $R_{FB1}$ is coupled between the outer collector region 20 and the inner base region 24 and formed over the substrate 14 and is outside of the first region 38. At least a portion 40 of the feedback resistor $R_{FB1}$ is arc-shaped and resides over a first arcuate path defined by a substantially constant first radius r1 centered in the first region 38. In the exemplary embodiment depicted in FIG. 3, the entirety of the feedback resistor $R_{FB1}$ resides in the first arcuate path.

In at least the exemplary embodiment depicted in FIG. 3 the base resistor $R_{BB1}$ is coupled between the inner base region 24 and a fixed voltage node, which in this exemplary case is ground GND. The base resistor $R_{BB1}$ is formed over the substrate 14 and is outside of the first region 38. At least a first portion 42 of the base resistor $R_{BB1}$ is arc-shaped and resides over a second arcuate path defined by a substantially constant second radius r2 that is centered on the first region 38. In this exemplary embodiment the substantially constant first radius r1 and the substantially constant second radius r2 are the same. However, it is to be understood that in other embodiments, the substantially constant first radius r1 and the substantially constant second radius r2 are different.

In the exemplary embodiment of FIG. 3, at least a second portion 44 of the base resistor $R_{BB1}$ is arc-shaped and resides over a third arcuate path defined by a substantially constant third radius r3 that is centered over the first region 38. Moreover, at least a third portion 46 of the base resistor $R_{BB1}$ is arc-shaped and resides over a fourth arcuate path defined by a substantially constant fourth radius r4 centered over the first region 38.

The bias resistor $R_{BIAS1}$ is coupled between the outer base region 26 and a fixed voltage node, which in this exemplary embodiment is ground GND. The bias resistor $R_{BIAS1}$ is formed over the substrate 14 and outside of the first region 38. The bias resistor $R_{BIAS1}$ is coupled between the outer base region 26 and a fixed voltage node, which in this exemplary case is ground GND. At least a portion 48 of the bias resistor $R_{BIAS1}$ is arc-shaped and resides over a fifth arcuate path defined by a substantially constant fifth radius r5 centered over the first region 38.

The emitter resistor $R_{E2}$ is coupled between the outer emitter region 32 and a fixed voltage node, which in this exemplary embodiment is ground GND. The emitter resistor $R_{E2}$ is formed over the substrate 14 and is outside of the first region 38. At least a first portion 50 of the emitter resistor $R_{E2}$ is arc-shaped and resides over a sixth arcuate path defined by a substantially constant sixth radius r6 centered over the first region 38. The resistors $R_{FB1}$, $R_{BB1}$, $R_{BIAS1}$, and $R_{E2}$ can all be of the thin film type.

Figure 5:
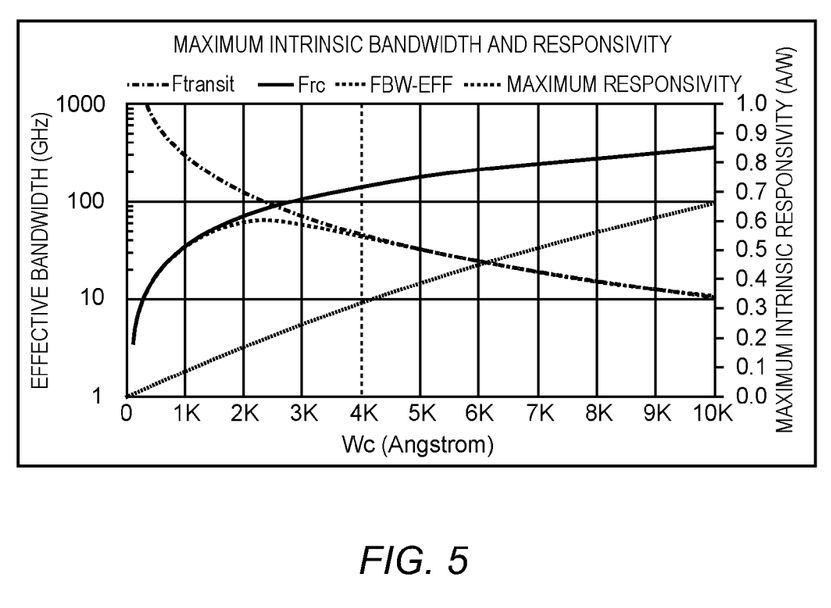
FIG. 5 is a graph based on intrinsic detector calculations for the HPD transistor configuration depicted in FIG. 4.

Returning to FIG. 4, a positive-intrinsic-negative (p-i-n) region is made up of the inner base region 24 that is P+ doped, the inner collector region 18 that is intrinsic and the sub-collector region 36 that is N+ doped. Intrinsic responsivity and bandwidth of the p-i-n region are calculated based on equations found in Chong, Li et al., "*High bandwidth surface-illuminated InGaAs/InP uni-travelling-carrier photodetector*," Chin. Phys. B, Vol. 22, No. 11 (November 2013) 118503, which is incorporated herein by reference. FIG. 5 is a nomograph based on intrinsic detector calculations for the HPD transistor configuration 12 depicted in FIG. 4. Exemplary intrinsic detector calculations assume a vertical indium gallium arsenide (InGaAs) detector, a wavelength of detection of 1.55 μm, and an intrinsic region (i-region) that is undoped. Further assumptions are that the inner collector region 18 is 4000 Angstroms thick and that a window of detection is 10 μm in diameter. Other assumptions are 100% quantum efficiency and ideal optical coupling. Under these assumptions, the calculations yield a maximum responsivity of approximately 0.324 amperes per Watt (A/W). Transit time bandwidth (Ftransit) and resistance-capacitance (RC) limited bandwidth ($F_{RC}$) calculations are 112.3 GHz and 78.8 GHz respectively.

In particular, FIG. 5 illustrates calculated intrinsic detector bandwidth and maximum responsivity versus collector thickness, Wc. As the collector thickness Wc is increased, the responsivity increases due to increased volume of the detection i-region. As a decrease in intrinsic detector capacitance and an increase in RC-limited bandwidth $F_{RC}$ occurs, the larger the collector thickness Wc becomes. However, the transit time bandwidth Ftransit decreases with larger Wc. Therefore, a point exists on the graph of FIG. 5 where the transit time and RC-limited bandwidth $F_{RC}$ calculations are equal. In this exemplary case, points of interest are located along intersections of a vertical line where the collector thickness Wc is 4000 Angstroms. The maximum responsivity found along the vertical line with a collector thickness Wc of 4000 Angstroms is 0.324 A/W and the effective bandwidth is 44.8 GHz.

The HPD transistor configuration 12 amplifies the intrinsic responsivity by a current gain H21, which is associated with an effective responsivity of the active photonic device 10. An effective bandwidth for the active photonic device 10 can be approximated by calculating the square root of a summation of the RC-limited bandwidth $F_{RC}$, the transit time bandwidth Ftransit, and a bandwidth associated with current gain H21. An overall opto-electrical integrated circuit (OEIC) response is evaluated by calculating a product of amplifier transimpedance Tz with the intrinsic responsivity of the p-i-n region given in V/W.

Figure 6:
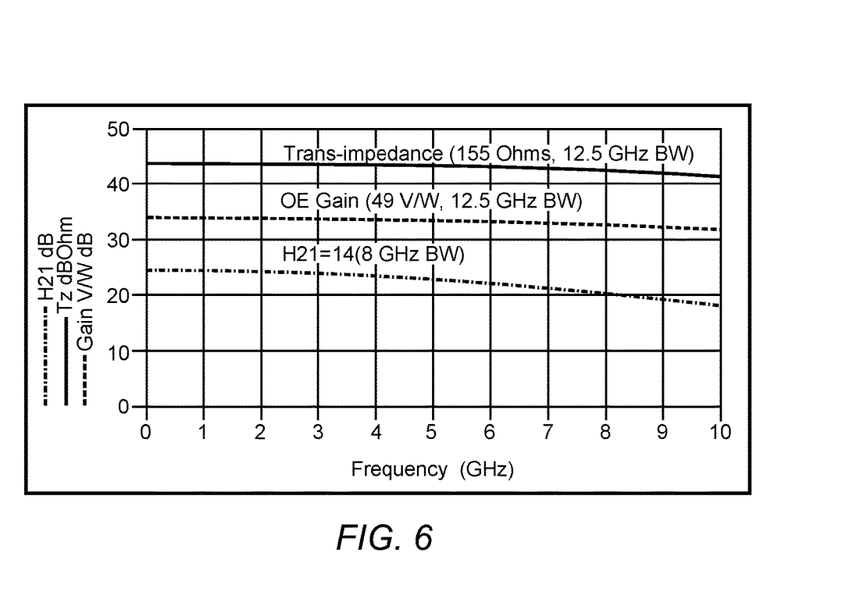
FIG. 6 is an opto-electric integrated circuit (OEIC) response graph for 10 Gbs operation of the active photonic device.

FIG. 6 is an OEIC response graph for 10 Gbps operation of the active photonic device 10. In this example, a bias point is selected to be 3V-13 mA for the active photonic device 10. The HPD current gain is 14 with an associated bandwidth of 8 GHz. The effective responsivity of the HPD is approximately 4.48 A/W. The effective transimpedance gain is 155 Ohms with a bandwidth of 12.5 GHz and the overall effective OE Gain is 49 V/W with an effective 12.5 GHz BW.

Figure 7:
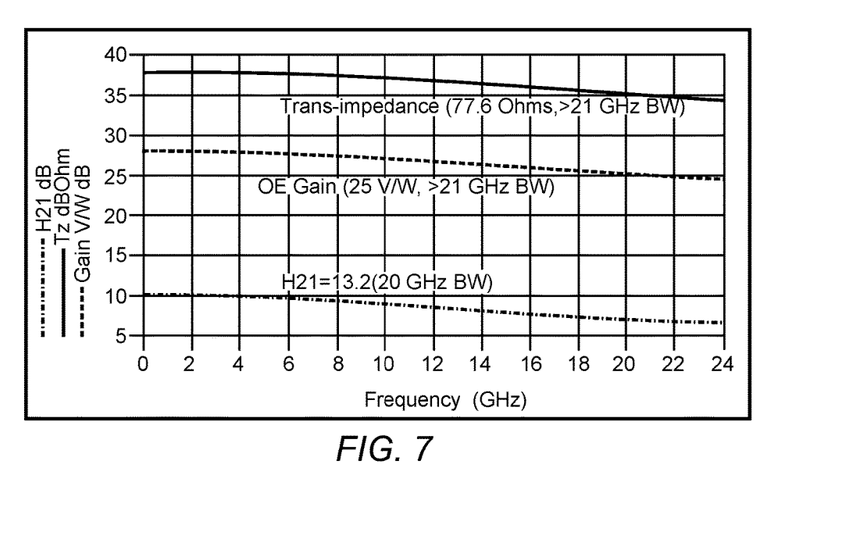
FIG. 7 is an OEIC response graph for 28 Gbs operation of the active photonic device.

FIG. 7 is an OEIC response graph for 28 Gbs operation of the active photonic device 10. The bias point is selected to be 3V-13 mA for the active photonic device 10. The HPD current gain is 3.2 with an associated bandwidth of 20 Ghz. The effective HPD responsivity is approximately 1 A/W. The effective transimpedance gain is 77.6 Ohms with a bandwidth of >21 GHz. The overall effective OE Gain is 25 V/W with an effective >21 GHz bandwidth. In at least one embodiment, the active photonic device is configured to receive a modulated light signal with a bit rate of at least 100 Gbps and an electrical signal of at least 100 Gbps. Moreover, in at least some embodiments, the active photonic device 10 operates at a supply voltage that is between 1 V and 5 V.

Figure 8:
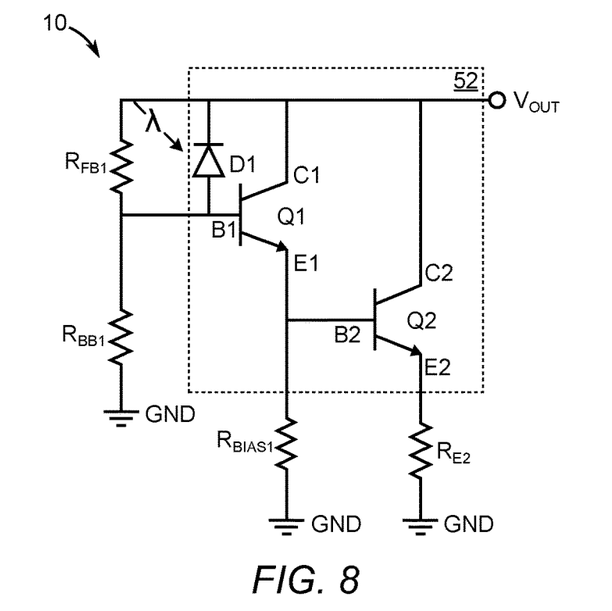
FIG. 8 is a symbolic diagram of an active photonic device of the present disclosure depicted in a p-i-n Darlington common-emitter configuration with feedback.
Figure 9:
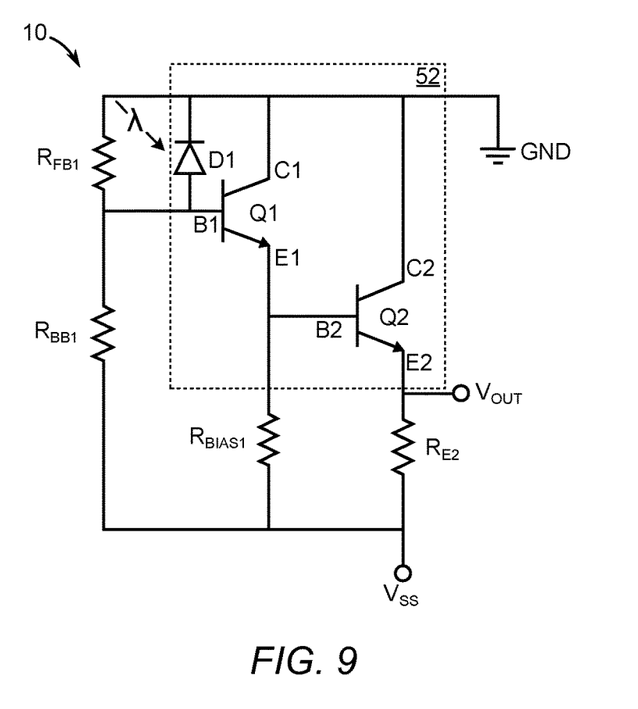
FIG. 9 is a symbolic diagram of the active photonic device of the present disclosure depicted in a p-i-n Darlington common-collector configuration with feedback.

FIG. 8 is a symbolic diagram of the active photonic device 10 depicted in a p-i-n Darlington common-emitter configuration with feedback, and FIG. 9 is a symbolic diagram of the active photonic device 10 depicted in a p-i-n Darlington common-collector configuration with feedback. In both configurations, an alternative HPD transistor configuration 52 includes a p-i-n diode D1 that has an anode coupled between the inner base B1 and the inner collector C1. Also, both schematics of FIG. 8 and FIG. 9 show that the p-i-n diode is effectively in parallel with the feedback resistor $R_{FB1}$.

Figure 10:
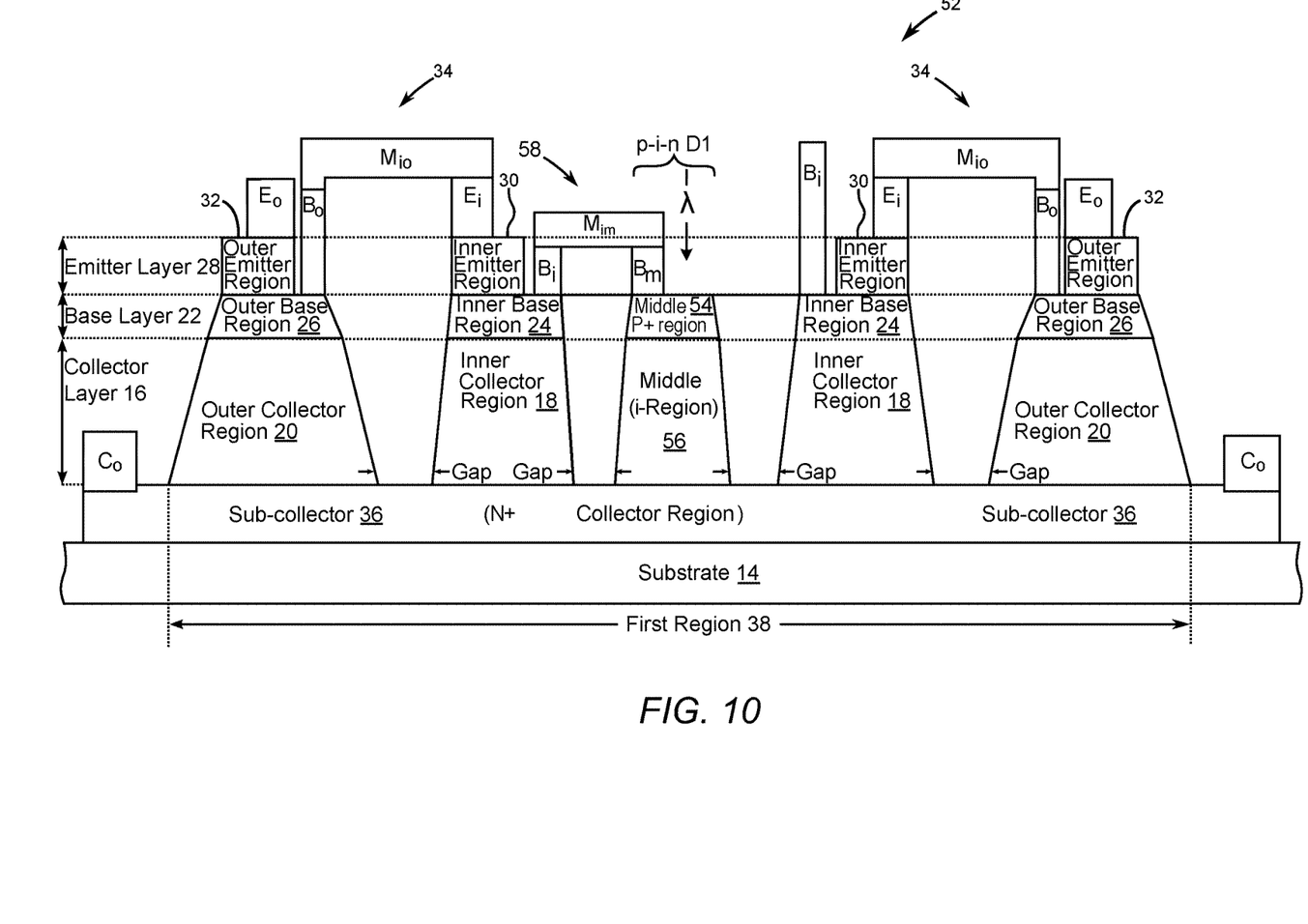
FIG. 10 is a vertical cross-section diagram of the Darlington transistor configuration that is shown symbolically in FIG. 8 and FIG. 9.

FIG. 10 is a vertical cross-section diagram of an alternate embodiment of the alternative HPD transistor configuration 52 that is shown symbolically in FIG. 8 and FIG. 9. The p-i-n Darlington transistor configuration includes the p-i-n diode D1, which is made up of a middle P+ region 54 and a middle i-region 56 that resides between the sub-collector region 36 and the middle P+ region 54. The p-i-n diode D1 is substantially centered within the first region 38. A middle connector structure 58 couples the anode of the p-i-n diode D1 to the inner base region 24. The middle connector structure 58 has a middle contact $B_m$ that is in contact with the middle P+ region 54 and a metal bridge $M_{im}$ that couples the middle contact $B_m$ to the inner base region 24 through the inner base contact B. A first gap surrounding the p-i-n diode D1 provides isolation from the inner collector region 18, and a second gap surrounding the inner collector region 18 provides isolation from the outer collector region 20.

Figure 11:
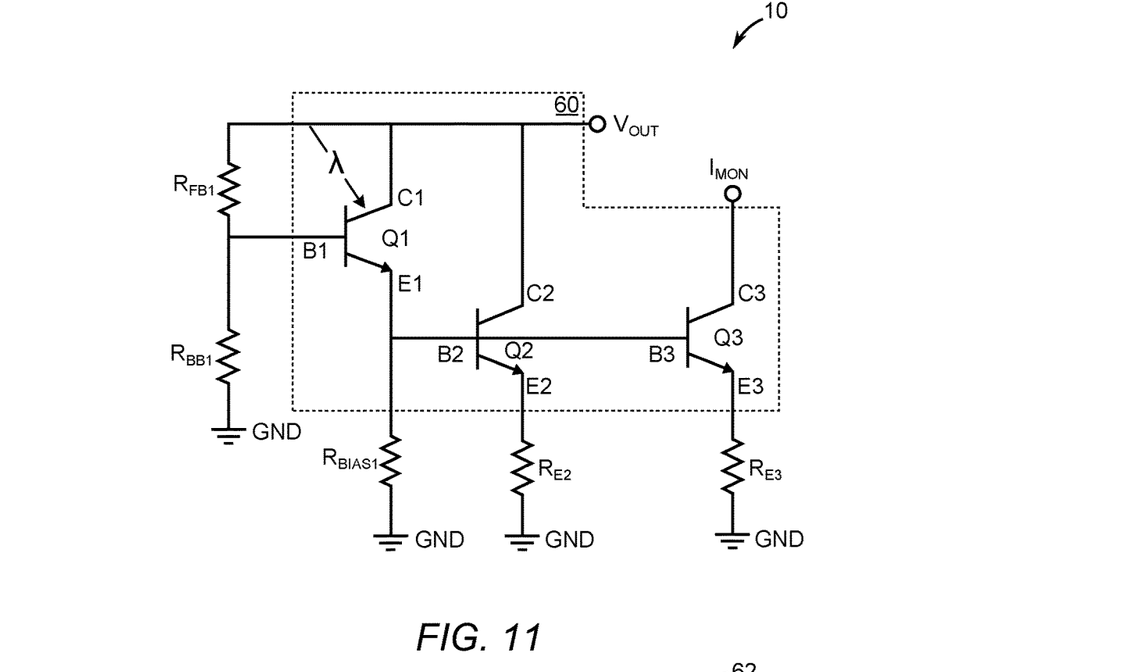
FIG. 11 is a symbolic diagram of an embodiment of the active photonic device that includes a built-in current monitor that is usable to align a fiber optic cable with light responsive regions of the active photonic device.

FIG. 11 is a symbolic diagram of an embodiment of the active photonic device 10 in which an HPD transistor configuration 60 includes a built-in current monitor in the form of a third transistor Q3. The built-in current monitor is usable to align a fiber optic cable with light responsive regions of the active photonic device 10. The third transistor Q3 comprising the built-in current monitor has a base B3 coupled to the emitter E1 of the first transistor Q1. The third transistor Q3 also has a collector C3 that is coupled to a current monitoring ($I_{MON}$) terminal External devices (not shown) can be coupled to the current monitoring terminal $I_{MON}$ to provide feedback to a human technician that aligns an optical data transmitter with the active photonic detector 10. In operation, a more strongly coupled light source will generate more current flow through the $I_{MON}$ terminal. In contrast, poor alignment will lead to less current flow through the $I_{MON}$ terminal. A third emitter resistor $R_{E3}$ coupled between a fixed voltage node and an emitter E3 of the third transistor Q3, is usable to bias the third transistor Q3 for operation at a desired operating point. The fixed voltage node in this exemplary case is ground. The third resistor R3 can be constructed along a arcuate path similar to the arcuate paths defined by substantially constant radii r1-r6 depicted in FIG. 3. The third resistor R3 can be fabricated using thin film technology.

Figure 12:
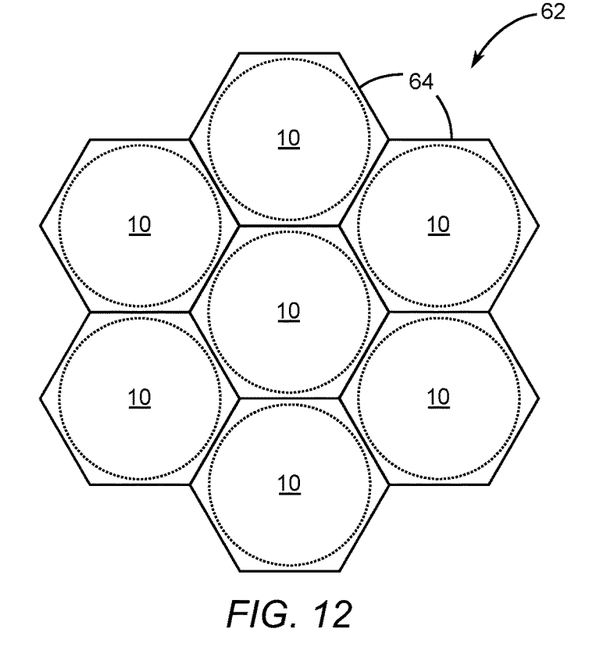
FIG. 12 is a simplified top view diagram of a photodetector array made up of a plurality of the active photonic device of the present disclosure.

FIG. 12 is a simplified top view diagram of a photodetector array 62 made up of a plurality of the active photonic device 10 having the built-in current monitor 60. An ohmic contact 64 coupled to the collector layer 16 (FIG. 10) is polygon-shaped in at least one embodiment. In an exemplary embodiment, the ohmic contact 64 is hexagonal shaped. The collector layer 16 is represented by a dashed circle because in this exemplary embodiment a light signal is received from the backside. In this embodiment, the substrate 14 (FIG. 10) is optically translucent to a desired wavelength of light to be received by the photodetector array 62. Due to the hexagonal shape, the photodetector array 64 is efficient with regard to footprint and detector area. As such, applications of this disclosure extend into high datarate serial and/or parallel communications as well as compact voltaic solar cells wherein the disclosed ring-shaped regions have a multi-quantum structure with high spectral absorption/detection of light, which is typical of triple or multi-quantum well structures.

Figure 13:
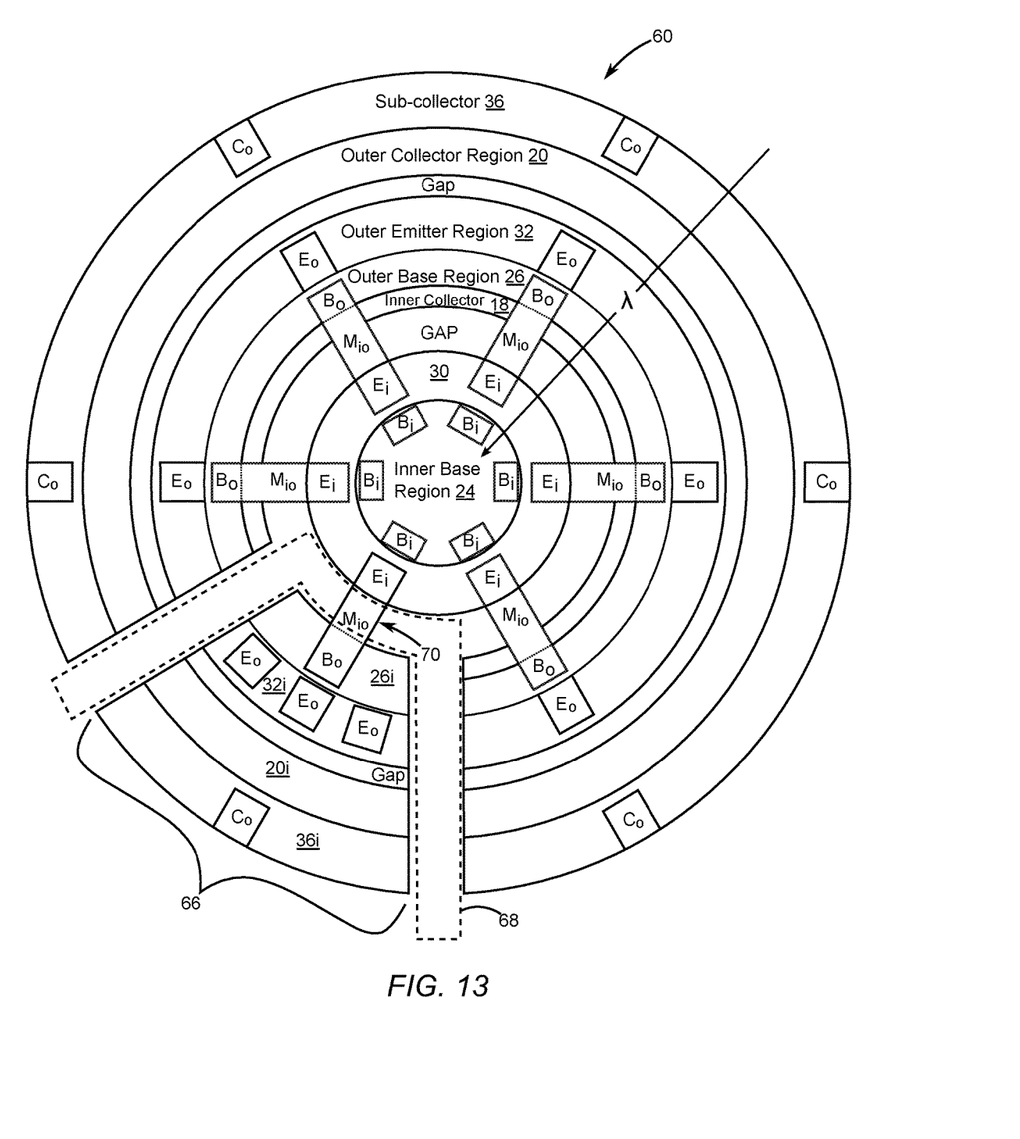
FIG. 13 is a horizontal cross-section diagram of the active photonic device of FIG. 11 that depicts an isolated section of circular transistor elements that comprise the built-in current monitor.

FIG. 13 is a horizontal cross-section diagram of the HPD transistor configuration 60 symbolically depicted in FIG. 11. An isolated section 66 of the HPD transistor configuration 60 comprises the third transistor Q3. In this exemplary embodiment, the isolation section 66 is isolated from other sections of the HPD transistor configuration 60 by an etched boundary 68. As such, the third transistor Q3 is made up of an outer collector region 20i, an isolated outer base region 26i, an isolated outer emitter 32i, and an isolated sub-collector 36i. A isolation connector structure 70 couples the inner emitter region 30 with the isolated outer base region 26i.

Those skilled in the art will recognize improvements and modifications to the preferred embodiments of the present disclosure. All such improvements and modifications are considered within the scope of the concepts disclosed herein and the claims that follow.

What is claimed is:

1. An active photonic device having a Darlington configuration comprising:
    a substrate;
    a collector layer over the substrate and comprising:
        an inner collector region; and
        an outer collector region that substantially surrounds the inner collector region;
    a base layer over the collector layer comprising:
        an inner base region; and
        an outer base region that substantially surrounds and is spaced apart from the inner base region;
    an emitter layer over the base layer and comprising:
        an inner emitter region that is ring-shaped and resides over and extends substantially around an outer periphery of the inner base region; and
        an outer emitter region that is ring-shaped and resides over and extends substantially around the outer base region;
    a connector structure that electrically couples the inner emitter region with the outer base region, wherein the collector layer, base layer, the emitter layer, and the connector structure are substantially centered within a first region over the substrate; and
    a feedback resistor coupled between the outer collector region and the inner base region and formed over the substrate and outside of the first region.

2. The active photonic device of claim 1 wherein at least a portion of the feedback resistor is arc-shaped and resides over a first arcuate path defined by a substantially constant first radius centered in the first region.

3. The active photonic device of claim 2 wherein an entirety of the feedback resistor resides in the first arcuate path.

4. The active photonic device of claim 2 further including a base resistor coupled between the inner base region and a fixed voltage node and formed over the substrate and outside of the first region wherein at least a first portion of the base resistor is arc-shaped and resides over a second arcuate path defined by a substantially constant second radius centered over the first region.

5. The active photonic device of claim 4 wherein the substantially constant first radius and the substantially constant second radius are the same.

6. The active photonic device of claim 4 wherein the substantially constant first radius and the substantially constant second radius are different.

7. The active photonic device of claim 4 wherein at least a second portion of the base resistor is arc-shaped and resides over a third arcuate path defined by a substantially constant third radius centered over the first region, and wherein at least a third portion of the base resistor is arc-shaped and resides over a fourth arcuate path defined by a substantially constant fourth radius centered over the first region.

8. The active photonic device of claim 2 further including a bias resistor coupled between the outer base region and a fixed voltage node and formed over the substrate and outside of the first region wherein at least a first portion of the bias resistor is arc-shaped and resides over a fifth arcuate path defined by a substantially constant fifth radius centered over the first region.

9. The active photonic device of claim 2 further including an emitter resistor coupled between the outer emitter region and a fixed voltage node and formed over the substrate and outside of the first region wherein at least a first portion of the emitter resistor is arc-shaped and resides over a sixth arcuate path defined by a substantially constant sixth radius centered over the first region.

10. The active photonic device of claim 2 further including a negatively doped (n+) sub-collector that resides between the collector layer and the substrate.

11. The active photonic device of claim 10 further including a middle intrinsic region that is substantially centered within the first region over the n+ subcollector, a middle positively doped (p+) region that resides over the middle intrinsic region, and a middle connector structure that couples the middle p+ region to the inner base region to form an isolated P-i-N diode structure.

12. The active photonic device of claim 2 wherein the inner collector region, the inner base region and the inner emitter region form a first transistor, and the outer collector region, the outer base region, and the outer emitter region form a second transistor.

13. The active photonic device of claim 12 wherein the first transistor and the second transistor are configured as a heterojunction bipolar transistor-photonic device (HBT-PD).

14. The active photonic device of claim 12 further including a built-in current monitoring device comprising:
    an outer base section that is electrically isolated from the outer base region, wherein the outer base section is coupled to the inner emitter region;
    an outer emitter section that is electrically isolated from the outer emitter region and adjacent to and separated from the outer base section; and
    an outer collector section that is electrically isolated from the outer collector region and adjacent to and separated from the outer emitter section, wherein the outer base section, the outer emitter section, and the outer collector section form a third transistor.

15. The active photonic device of claim 2 wherein the substrate is transparent to at least one wavelength of light such that a light signal is back-side coupled through the substrate.

16. The active photonic device of claim 2 wherein the substrate is transparent to at least one wavelength of light such that a light signal is edge coupled through the substrate.

17. The active photonic device of claim 2 further including a polygon-shaped ohmic contact coupled to the collector layer.

18. The active photonic device of claim 17 wherein the polygon-shaped ohmic contact is configured to mechanically and electrically couple to a plurality of similarly configured active photonic devices.

19. The active photonic device of claim 2 configured to operate at a supply voltage between 1 V and 5 V.

20. The active photonic device of claim 2 wherein the collector layer, the base layer, and the emitter layer are made of group III-V semiconductor compounds.

21. The active photonic device of claim 2 configured to receive a modulated light signal with a bit rate of at least 100 Gbps and an electrical signal of at least 100 Gbps.

22. The active photonic device of claim 1 further including a negatively doped (n+) sub-collector that resides between the collector layer and the substrate.

23. The active photonic device of claim 1 wherein the inner collector region, the inner base region and the inner emitter region form a first transistor, and the outer collector region, the outer base region, and the outer emitter region form a second transistor.

24. The active photonic device of claim 23 further including a middle intrinsic region that is substantially centered within the first region over the n+ subcollector, a middle positively doped (p+) region that resides over the middle intrinsic region, and a middle connector structure that couples the middle p+ region to the inner base region to form an isolated P-i-N diode structure.

25. The active photonic device of claim 1 wherein the inner collector region, the inner base region and the inner emitter region form a first transistor, and the outer collector region, the outer base region, and the outer emitter region form a second transistor.

26. The active photonic device of claim 25 wherein the first transistor and the second transistor are configured as a heterojunction bipolar transistor-photonic device (HBT-PD).

27. The active photonic device of claim 25 further including a built-in current monitoring device comprising:
an outer base section that is electrically isolated from the outer base region, wherein the outer base section is coupled to the inner emitter region;
an outer emitter section that is electrically isolated from the outer emitter region and adjacent to and separated from the outer base section; and
an outer collector section that is electrically isolated from the outer collector region and adjacent to and separated from the outer emitter section, wherein the outer base section, the outer emitter section, and the outer collector section form a third transistor.

28. The active photonic device of claim 1 configured to operate at a supply voltage between 1 V and 5 V.

29. The active photonic device of claim 1 configured to receive a modulated light signal with a bit rate of at least 100 Gbps and an electrical signal of at least 100 Gbps.

30. An active photonic device having a Darlington configuration comprising:
a substrate;
a collector layer over the substrate and comprising:
an inner collector region; and
an outer collector region that substantially surrounds the inner collector region;
a base layer over the collector layer comprising:
an inner base region; and
an outer base region that substantially surrounds and is spaced apart from the inner base region;
an emitter layer over the base layer and comprising:
an inner emitter region that is ring-shaped and resides over and extends substantially around an outer periphery of the inner base region; and
an outer emitter region that is ring-shaped and resides over and extends substantially around the outer base region;
a connector structure that electrically couples the inner emitter region with the outer base region, wherein the collector layer, base layer, the emitter layer, and the connector structure are substantially centered within a first region over the substrate;
a feedback resistor coupled between the inner collector region and the inner base region and formed over the substrate and outside of the first region wherein at least a portion of the feedback resistor is arc-shaped and resides over a first arcuate path defined by a substantially constant first radius centered in the first region;
a bias resistor coupled between the outer base region and a fixed voltage node and formed over the substrate and outside of the first region wherein at least a first portion of the bias resistor is arc-shaped and resides over a second arcuate path defined by a substantially constant second radius centered over the first region; and
an emitter resistor coupled between the outer emitter region and the fixed voltage node and formed over the substrate and outside of the first region wherein at least a first portion of the emitter resistor is arc-shaped and resides over a third arcuate path defined by a substantially constant third radius centered over the first region.

31. The active photonic device of claim 30 configured in a common-emitter configuration wherein the fixed voltage node is ground.

32. The active photonic device of claim 30 configured in a common-collector configuration wherein the fixed voltage node is a nonzero supply voltage node.

33. The active photonic device of claim 30 further including a sub-collector that resides between the collector layer and the substrate.

34. The active photonic device of claim 30 wherein the inner collector region, the inner base region and the inner emitter region form a first transistor, and the outer collector region, the outer base region, and the outer emitter region form a second transistor.

* * * * *

UNITED STATES PATENT AND TRADEMARK OFFICE
CERTIFICATE OF CORRECTION

PATENT NO. : 9,933,304 B2
APPLICATION NO. : 15/219879
DATED : April 3, 2018
INVENTOR(S) : Kevin Wesley Kobayashi Page 1 of 1

It is certified that error appears in the above-identified patent and that said Letters Patent is hereby corrected as shown below:

In the Specification

In Column 8, Line 2, replace "inner base contact B." with --inner base contact $B_i$.--.

Signed and Sealed this
Fifteenth Day of May, 2018

Andrei Iancu
*Director of the United States Patent and Trademark Office*